April 9, 1963 J. PARSTORFER 3,084,649

DE-SOLDERING TIP

Filed Oct. 31, 1960

INVENTOR.
JOHN PARSTORFER

BY Samuel Kane
ATTORNEY

United States Patent Office 3,084,649

Patented Apr. 9, 1963

3,084,649
DE-SOLDERING TIP

John Parstorfer, Philadelphia, Pa., assignor to Burroughs Corporation, Detroit, Mich., a corporation of Michigan Filed Oct. 31, 1960, Ser. No. 66,305
2 Claims. (Cl. 113—111)

This invention relates to a de-soldering tip for soldering irons and the like for disconnecting soldered joints.

In the electronics art, for example, certain types of electrical components having a plurality of lead wires are mounted adjacent to one face of a printed circuit board with the lead wires projecting through apertures in the board and soldered against the opposite face of the board to appropriate printed circuit conductors. Occasionally it is necessary to remove such components from the board for one reason or another, such as for modification or replacement, and such operations have heretofore been most difficult. In one case, attempts were made to desolder the component leads one at a time, but this method proved too cumbersome and required constant manipulation of the component in order to free it from the board. Furthermore, the solder was not completely removed at each lead wire so that by the time the operator had proceeded to the last lead wire, the remaining bits of solder had already hardened at the previous lead wires, thereby necessitating a repetition of the operation. Another method was tried in which a single bath of molten solder was applied to all the lead wires simultaneously, in an effort to melt their soldered joints all at once, but this too was unsatisfactory since it resulted in scorching the printed circuit board, and required the exercise of extreme care in handling to avoid spilling and splattering of the solder and possible injury to the operator.

An object of the invention is to provide an improved tip for a soldering iron or the like for disconnecting soldered joints.

Another object of the invention is to provide a desoldering tip for a soldering iron or the like for disconnecting a plurality of soldered joints in one simple operation.

Another object of the invention is to provide such a desoldering tip for disconnecting the soldered joints of a component whereby a minimum amount of heat will be transferred to parts adjacent to the component, as well as to the component itself.

A further object of the invention is to provide a desoldering tip which utilizes open baths of molten solder for simultaneously disconnecting a plurality of soldered joints, and which may be used in any position without spilling the solder out of the baths.

In accordance with the above objects and first considered briefly in its broad aspects, the invention comprises a de-soldering tip for a soldering iron or the like, the tip being constructed to contain molten solder for melting the solder at soldered joints.

The invention will be more clearly understood when the following detailed description of the preferred embodiment thereof is read in conjunction with the accompanying drawings in which.

Figure 1:
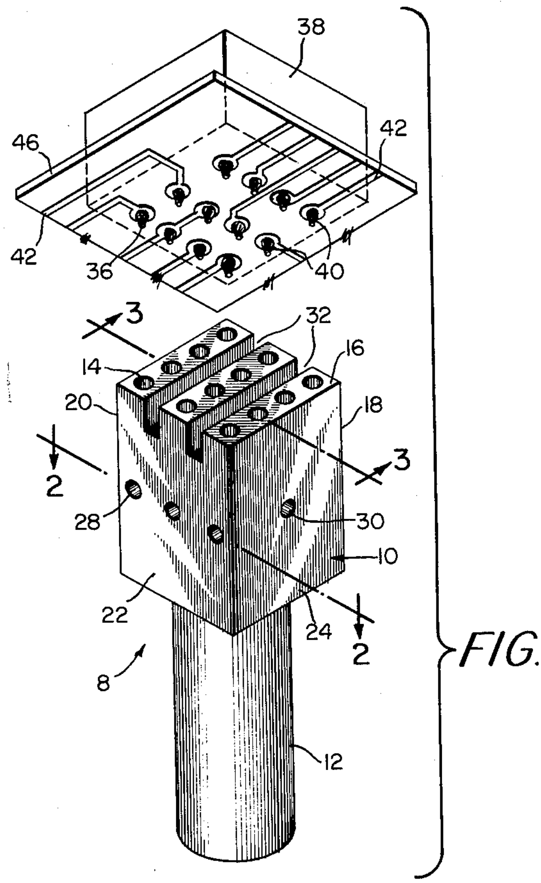
FIGURE 1 shows an isometric view of a de-soldering tip constructed in accordance with the invention, and an isometric view of a fragment of a printed circuit panel having an electrical component soldered thereto to which the de-soldering tip is to be applied for disconnecting the soldered joints of the electrical component lead wires.
Figure 3:
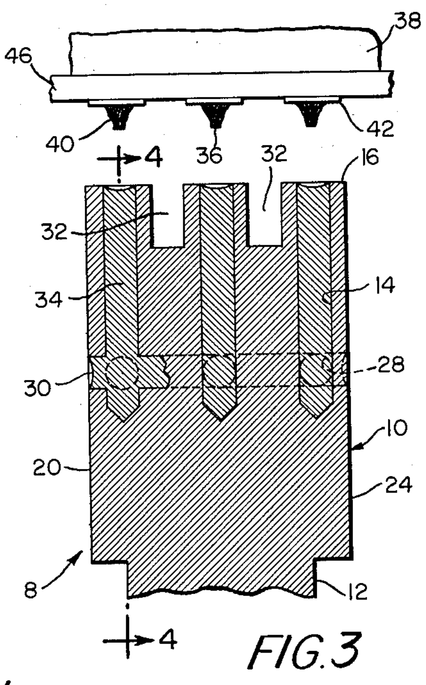
Figure 4:
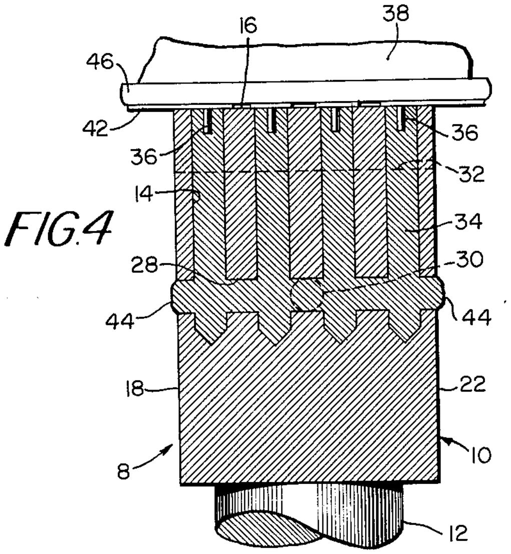
Figure 2:
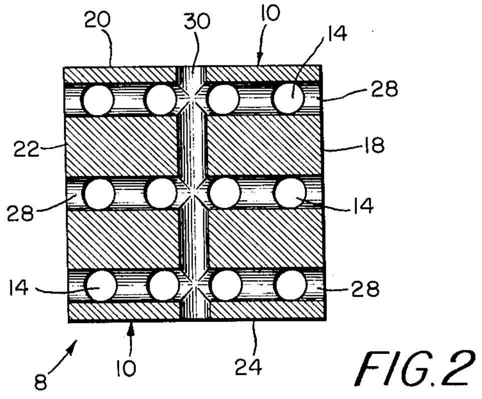
FIGURE 2 is an enlarged sectional view of the desoldering tip taken along line 2—2 of FIGURE 1.

FIGURE 3 is an enlarged fragmentary sectional view taken along line 3—3 of FIGURE 1 showing the desoldering tip filled with solder and illustrating its position relative to the printed circuit panel preparatory to disconnecting the soldered joints of the electrical component lead wires; and FIGURE 4 is a sectional view taken along line 4—4 of FIGURE 3 and showing the operated condition of the desoldering tip for melting the solder around the lead wires of the electrical component.

Turning now to the details of the drawings, a metallic de-soldering tip 8, representing the preferred embodiment of the invention, is provided with a rectangular head 10 and a circular shaft 12. The shaft 12 provides a connection means for attachment of the de-soldering tip 8 to the shank of a soldering iron or the like, not shown, the soldering iron being preferably of the electric type provided with a heating element for heating the head 10, in a manner well-known.

The head 10 is provided with a plurality of vertical passages 14 which open at their upper ends into a working face 16. As will be pointed out more clearly hereinafter, the side faces 18, 20, 22 and 24 may also be utilized as working faces in particular applications. The passages 14 extend inwardly from the working face 16 and at their lower regions intersect with cross passages 28, the latter passages intersecting with a cross passage 30. With this construction, each passage 14 may be regarded as opening at its lower end at any one of the faces 18, 20, 22 or 24.

To minimize the amount of heat transferred to parts adjacent to the joints to be disconnected, the working face, in this case the working face 16, is preferably reduced in area by forming therein slots or recesses 32, each between adjacent linear rows of passages 14.

The diameters, or cross-sections, of the passages 14, 28 and 30 respectively are of such size as to enable the passages to contain therein molten solder by capillary action.

The passages 14, 28 and 30 are loaded with solder 34 and the head 10 heated, preferably through the medium of the heating element in an electric soldering iron, mentioned above, until the solder 34 is melted and is in the condition shown in FIGURE 3, the molten solder 34 being retained in the passages by capillary action.

In its operation, the de-soldering tip 8 is applied to all the leads 36 of the electrical component 38, simultaneously, to enter each lead 36 into a passage 14, as shown in FIGURE 4, until the solder 40 connecting the leads 36 to the printed circuit conductors 42 is melted by the heat from the solder 34. The molten solder 40 will then flow into the passages 14 and cause a corresponding amount of solder 34 to bulge outwardly as at 44. At the instant that the solder 40 melts sufficiently to free the leads 36, the component 38 may be easily removed from the printed circuit board 46 simply by pulling it out with a quick jerk-like motion. It will now be obvious that the component 38 and printed circuit board 46 will be exposed to the heat of the de-soldering tip 8 for only a very short time.

Since the solder 34 is retained in the passages 14, 28 and 30 by capillary action, the de-soldering tip 8 may be used in any position. Also, the head 10 may take any desired shape, preferably rectangular, as shown, and any of the faces 18, 20, 22 or 24 may be used as working faces. In the latter case, it would be preferable to form these faces with recesses such as 32, to minimize heat transfer to adjacent parts, as mentioned above.

While there has been described a specific embodiment of the invention, it is to be understood that the invention is capable of being constructed in a variety of shapes, sizes and modifications without departing from the true spirit and scope thereof. Accordingly, it is to be understood that the invention is not to be limited by the specific structure disclosed but only by the subjoined claims.

What is claimed is:

1. A de-soldering tip for simultaneously disconnecting a multiplicity of soldered lead wire terminls of an electrical component, said lead wire terminls extending through and soldered to a printed circuit board and spaced apart in a predetermined pattern, said de-soldering tip comprising a polygonally-shaped solid head portion constituting a plurality of faces, means carried by said head portion for connection of the de-soldering tip to a hand-type soldering iron, a plurality of spaced apart elongated passages of substantially uniform cross section throughout their lengths each opening at one end into one of said faces and at its other end into one of the other of said faces, the passage openings in said one of said faces being arranged in a pattern corresponding with said predetermined pattern of said lead wire terminals, and a plurality of recesses formed in said one of said faces each between groups of the associated passage openings, to minimize heat transfer to said printed circuit board when a heated said de-soldering tip is applied to said lead wire terminals, the cross section of each said passage being of such size as to enable molten solder to be supported therein by capillary action and as to enable said soldered lead wire terminals to be received into said passages.

2. A de-soldering tip for simultaneously disconnecting a multiplicity of soldered lead wire terminals of an electrical component, said lead wire terminals extending through and soldered to a printed circuit board and spaced apart in a predetermined pattern, said de-soldering tip comprising, an elongated head portion having an end face and a side surface, means carried by said head portion for connection of the de-soldering tip to a hand-type soldering iron, a plurality of groups of bores corresponding in position with said predetermined pattern of lead wire terminals and extending inwardly into said head portion from said end face thereof, additional bores extending into the head portion from said side surface and each intersecting a group of said first mentioned bores, and another bore interconnecting said additional bores such that all said bores are interconnected, and a plurality of spaced apart recesses formed in said end face each between groups of the associated bores, to minimize heat transfer to said printed circuit board when a heated said de-soldering tip is applied to said lead wire terminals, the cross section of each said bore being of such size as to enable molten solder to be supported therein by capillary action and the cross section of each bore of said plurality of groups of bores being of such size as to enable said soldered lead wire terminals to be received into said last mentioned bores.

References Cited in the file of this patent

UNITED STATES PATENTS

| | | |
|---|---|---|
| 2,462,131 | Rustin | Feb. 22, 1949 |
| 2,725,026 | Brandt | Nov. 29, 1955 |

FOREIGN PATENTS

| | | |
|---|---|---|
| 528,120 | Great Britain | Oct. 23, 1940 |